(12) United States Patent
Kanno et al.

(10) Patent No.: US 7,399,321 B2
(45) Date of Patent: Jul. 15, 2008

(54) SOLDERING METHOD OF NONAQUEOUS-ELECTROLYTE SECONDARY-BATTERY

(75) Inventors: Yoshimi Kanno, Sendai (JP); Agasa Egashira, Sendai (JP); Hiroaki Ishikawa, Sendai (JP); Shunji Watanabe, Sendai (JP); Tsugio Sakai, Sendai (JP)

(73) Assignee: Seiko Instruments Inc. (JP)

( * ) Notice: Subject to any disclaimer, the term of this patent is extended or adjusted under 35 U.S.C. 154(b) by 573 days.

(21) Appl. No.: 11/031,361

(22) Filed: Jan. 7, 2005

(65) Prior Publication Data

US 2005/0167474 A1    Aug. 4, 2005

(30) Foreign Application Priority Data

Jan. 21, 2004    (JP)    ............... 2004-012897

(51) Int. Cl.
*B23K 31/02*    (2006.01)
(52) U.S. Cl. .............. 29/623.1; 29/623.2; 29/623.3; 29/623.4; 29/623.5; 228/183; 320/161; 320/135; 320/136

(58) Field of Classification Search ............... 228/429, 228/29, 183; 320/161, 135, 136; 29/623.1–623.5
See application file for complete search history.

(56) References Cited

U.S. PATENT DOCUMENTS 6,377,030 B1 *   4/2002   Asao et al. .................. 320/161
6,818,735 B2 * 11/2004   Yoshimura et al. .......... 528/425

* cited by examiner

*Primary Examiner*—Jerry A. Lorengo
*Assistant Examiner*—Erin P Barry
(74) *Attorney, Agent, or Firm*—Adams & Wilks

(57) ABSTRACT

In a method of reflow soldering, a non-aqueous electrolyte secondary battery is discharged to a first discharge voltage different from a second discharge voltage at an inflection point in a discharge curve of the non-aqueous electrolyte secondary battery having an axis of abscissa representing discharge capacity and an axis of ordinate representing discharge voltage. The discharged non-aqueous electrolyte secondary battery is placed on a substrate which is then exposed to a reflow soldering temperature to reflow solder the non-aqueous secondary battery to the substrate. The first discharge voltage is higher than the second discharge voltage to prevent degradation of characteristics of the non-aqueous electrolyte secondary battery resulting from decomposition of the non-aqueous electrolyte due to reaction of the non-aqueous electrolyte with excessive lithium ions in the cathode active material when the non-aqueous electrolyte secondary battery is exposed to the reflow soldering temperature.

11 Claims, 2 Drawing Sheets

SOLDERING METHOD OF NONAQUEOUS-ELECTROLYTE SECONDARY-BATTERY

BACKGROUND OF THE INVENTION

1. Field of the Invention

The present invention relates generally to reflow soldering and, more specifically, to a soldering method of a non-aqueous electrolyte secondary battery.

2. Background Art

A coin-type (button-type) nonaqueous-electrolyte secondary-battery has become more popular as a power supply for backup of devices because of its characteristics such as high energy density and lightweight.

When a secondary battery is used for a memory backup supply, in many cases, the battery is welded with a terminal for soldering, and then soldered on a printed circuit board together with a memory element. The soldering on the printed circuit board has been carried out using a soldering iron. However, since the number of electronic components mounted on a fixed area in the printed circuit board has been required to be increased with progress of miniaturization of devices or improvement in device performance, it has been difficult to secure a space for inserting the soldering iron. In addition, automation of soldering operation has been required for cost reduction.

Thus, a method is used, wherein soldering cream has been previously applied on a soldering area on the printed circuit board and components are placed thereon, or soldering globules are fed to the soldering area after the components have been placed, and then the printed circuit board mounted with the components is passed through a furnace in a high-temperature atmosphere, which is set such that the soldering area is at a melting point of the solder or more, for example, 200 to 260° C., thereby the solder is melted for soldering (hereinafter, referred to as reflow soldering).

The conventional coin-type (button-type) nonaqueous-electrolyte secondary-battery is not designed to withstand a high temperature at which the reflow soldering can be performed, and degradation or damage occurs in the battery due to the high temperature. Recently, a battery adaptable for the reflow soldering has been invented by using a battery material having heat resistance.

For example, a battery using an electrolyte having heat resistance (see, for:example, patent literature 1), a battery using an active material for cathode having the heat resistance (for example, patent literature 2), and a battery in which surface area of the active material for cathode is limited (see, for example, patent literature 3) are given.

[Patent Literature 1]
JP-A-2000-40525 (page 2, FIG. 1).
[Patent Literature 2]
JP-A-2002-117841 (page 3, FIG. 1).
[Patent Literature 3]
JP-A-2003-17120 (page 2, FIG. 1).

However, the conventional inventions show degradation of battery characteristics such as decrease in battery capacity or increase in internal resistance of the battery due to heat treatment during the reflow soldering process. A degree of the degradation varies not only for each reflow soldering lot, but also in a same lot, therefore the nonaqueous-electrolyte secondary-batteries after the reflow soldering process may not always exhibit the same battery characteristics. Therefore, the invention aims to provide a nonaqueous-electrolyte secondary-battery in which the degradation of the battery characteristics due to the heat treatment during the reflow soldering process is small, and a reflow soldering method of the nonaqueous-electrolyte secondary-battery in which the degradation of the battery characteristics is small.

SUMMARY OF THE INVENTION

The reflow soldering method of the nonaqueous-electrolyte secondary-battery of the invention has a discharging process for discharging the nonaqueous-electrolyte secondary-battery, and a heating process for placing the nonaqueous-electrolyte secondary-battery on a substrate and heating the substrate, wherein a discharge voltage value at the end of the discharge in the discharging process is higher than a voltage value that is an inflectional value on a discharge curve of the nonaqueous-electrolyte secondary-battery made with the discharge capacity in abscissa and the discharge voltage in ordinate.

Furthermore, the reflow soldering method of the nonaqueous-electrolyte secondary-battery of the invention has the discharging process for discharging the nonaqueous-electrolyte secondary-battery, and the heating process for placing the nonaqueous-electrolyte secondary-battery on the substrate and heating the substrate, wherein the discharge voltage value at the end of the discharging in the discharging process is higher than a discharge voltage value that is an inflectional value at the end of a voltage plateau region in the discharge curve of the nonaqueous-electrolyte secondary-battery made with the discharge capacity in abscissa and the discharge voltage in ordinate.

Preferably, in the reflow soldering method of the nonaqueous-electrolyte secondary-battery of the invention, the discharge voltage value at the end of the discharging in the discharging process is a voltage value or lower at which damage occurs in the substrate for placing the nonaqueous-electrolyte secondary-battery.

Furthermore, the reflow soldering method of the nonaqueous-electrolyte secondary-battery of the invention has the discharging process for discharging the nonaqueous-electrolyte secondary-battery, and the heating process for placing the nonaqueous-electrolyte secondary-battery on the substrate and heating the substrate, wherein electric capacity-discharged in the discharging process is 80% or lower of the total discharge capacity of the nonaqueous-electrolyte secondary-battery.

Preferably, in the reflow soldering method of the nonaqueous-electrolyte secondary-battery of the invention, the electric capacity discharged in the discharging process is 20% or lower of the total discharge capacity of the nonaqueous-electrolyte secondary-battery.

More preferably, in the reflow soldering method of the nonaqueous-electrolyte secondary-battery of the invention, the electric capacity discharged in the discharging process is 10% or lower of the total discharge capacity of the nonaqueous-electrolyte secondary-battery.

The invention keeps the battery from deteriorating the battery characteristics due to the reflow heat treatment in the nonaqueous-electrolyte secondary-battery which is soldered on a circuit board by the reflow soldering process by controlling the amount of discharge during the discharging when the discharging is carried out after assembling, or determining the discharge voltage at which the discharging is assumed to be completed by a profile of an initial discharge curve.

The invention enables the reflow soldering of the battery for preventing the degradation of the battery characteristics due to the reflow heat treatment by making the discharge voltage value at the end of the discharging in the discharging process to be higher than the discharge voltage value that is the inflectional value on the discharge curve of the nonaqueous-electrolyte secondary-battery made with the discharge capacity in abscissa and the discharge voltage in ordinate.

Furthermore, the invention enables the reflow soldering of the battery for preventing the degradation of the battery characteristics due to the reflow heat treatment by making the discharge voltage value at the end of the discharging in the discharging process to be higher than the discharge voltage value that is the inflectional value at the end of the voltage plateau region in the discharge curve of the nonaqueous-electrolyte secondary-battery made with the discharge capacity in abscissa and the discharge voltage in ordinate.

Furthermore, the invention combines prevention of the substrate from damage and the reflow soldering with suppressing the degradation of the battery characteristics due to the reflow heat treatment by making the discharge voltage value at the end of the discharging in the discharging process to be the voltage value or lower at which the damage occurs in the substrate for placing the nonaqueous-electrolyte secondary-battery.

Furthermore, the invention enables the reflow soldering of the battery with suppressing the degradation of the battery characteristics due to the reflow heat treatment by making the electric capacity discharged in the discharging process to be 80% or lower of the total discharge capacity of the nonaqueous-electrolyte secondary-battery.

Furthermore, the invention enables the reflow soldering of the battery with suppressing the degradation of the battery characteristics due to the reflow heat treatment by making the electric capacity discharged in the discharging process to be 20% or lower of the total discharge capacity of the nonaqueous-electrolyte secondary-battery.

The invention enables the reflow soldering of the battery with further suppressing the degradation of the battery characteristics due to the reflow heat treatment by making the electric capacity discharged in the discharging process to be 10% or lower of the total discharge capacity of the nonaqueous-electrolyte secondary-battery.

DETAILED DESCRIPTION OF THE PREFERRED EMBODIMENTS

Figure 1:
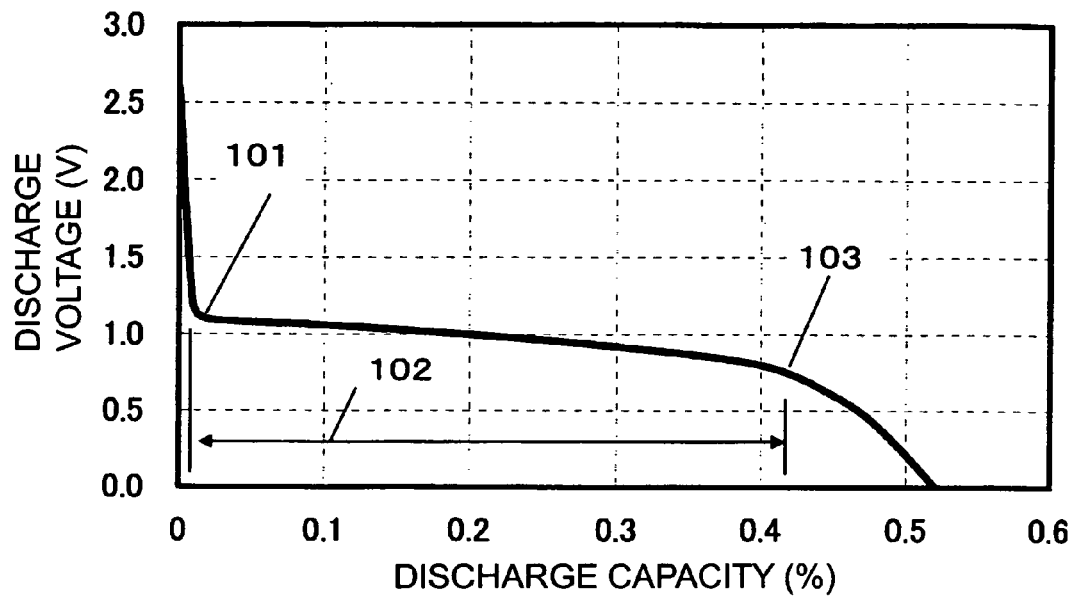
FIG. 1 is a graph showing an initial discharge curve of a battery produced in a first embodiment.

In the coin-type (button-type) nonaqueous-electrolyte secondary-battery, an anode is prepared by pressing metallic lithium against an anode electrode containing an active material for the anode capable of absorbing and desorbing lithium, and allowing the lithium to be absorbed in the active material for the anode by an electrochemical reaction in the presence of an electrolyte. Hereinafter, the battery at that time is called a battery immediately after assembling. The battery immediately after assembling is in a full charge condition, and hereinafter a battery voltage value at that time is called a voltage value at full charge.

The voltage value at full charge is specific to a battery system. To fully charge the battery again after discharging the battery, a voltage higher than the voltage value at full charge of the battery is applied. Although the battery immediately after charge exhibits a voltage close to the charge voltage, the voltage value drops to a value equal to the voltage value at full charge by leaving the battery.

Hereinafter initial discharge of the battery at full charge after assembling is called initial discharge. When a discharge curve is made using the initial discharge with the discharge capacity in abscissa and the discharge voltage in ordinate, a generally down-ward sloping curve is obtained with the voltage value at full charge as a base point at beginning of the discharge or at zero in abscissa.

In the discharge curve, when the discharge voltage is seen along the abscissa or discharge capacity, initially the discharge voltage drops abruptly with the voltage at full charge as the basepoint. In the short time, the discharge curve reaches a minimum value, and enters a voltage plateau region indicating a cell reaction. If the battery involves only one cell reaction, the discharge curve that reaches an inflection point at the voltage plateau region has a positive curvature, or the curve shows an inflectional value, and the voltage enters from the plateau region to a region where it abruptly drops again. In some cases, the discharge curve has two or more plateau regions depending on the active material. In the discharge curve when the plateau regions are small, the regions are sometimes seen as the inflection points.

Here, for convenience, the nonaqueous-electrolyte secondary-battery is divided into three regions depending on the end voltage in the discharging after assembling. In a discharge region A, the voltage value where a charge/discharge curve shows the minimum value from the voltage value at full charge, or voltage before entering the voltage plateau region indicating the cell reaction was assumed to be the end voltage of the initial discharge. A discharge region B is a region from a voltage value lower than that in the discharge region A to a voltage value at which the voltage plateau region indicating the cell reaction is completed, or a voltage region to the voltage showing the inflectional value through the inflection point. A region where discharging is performed to further low voltage value is assumed to be a discharge region C.

When each of the batteries in these three discharge regions is subjected to heat treatment in a reflow temperature pattern having a maximum temperature of 200° C. or more, degradation of battery performance due to the heat treatment varies significantly for each of the groups. The battery discharged to the discharge region A hardly shows the degradation of the battery performance due to the heat treatment. However, the degradation of the performance of the battery discharged to the discharge region B depends on the discharge voltage at the end of the discharging, and the degradation of the battery performance due to the heat treatment increases as the discharge voltage value decreases. However, if the voltage value at which the discharging is completed is higher than a discharge voltage value showing 20% of the battery capacity in the discharge curve, it can be considered that the degradation does not occur within a practical range. On the other hand, in the third group, the degradation is drastic, that is, the battery performance is significantly damaged, and functions as a battery are hardly exhibited after the reflow heat treatment.

Principles of the discharge condition of the battery depending on discharging after assembling the battery and the degradation of the battery performance during the reflow heat treatment can be considered as follows. In the battery showing the discharge voltage before the voltage plateau indicating the cell reaction in the discharge curve, or the battery discharged to the discharge region A, the cell reaction is not initiated yet, and electric potential of a capacitor component in the battery or oxides on a surface of the electrode is merely shown. This reaction other than the cell reaction is found only in the initial discharge, and not found in the charge or discharge thereafter. The battery in this discharge region does not show the degradation due to the reflow heat treatment. This is because even if a chemical reaction involved in the temperature during the heat treatment affects on the battery degradation due to the temperature, only an extremely small amount of chemical reactant exists in the battery.

On the other hand, in the battery discharged beyond the voltage plateau region indicating the cell reaction in the discharge curve, or in the battery discharged to the discharge region C, an internal battery reaction is completed, and the battery in this region significantly degrades due to the heat treatment during the reflow soldering. This can be considered as follows: lithium ions more than those absorbed in the active material in a cathode electrode portion where the cell reaction has been completed exist in a certain form, and the excessive lithium ions cause decomposition of the electrolyte by a chemical reaction due to the heat during the reflow soldering, resulting in degradation of the battery.

Furthermore, the battery in the voltage plateau region indicating the cell reaction in the discharge curve, or the battery discharged to the discharge region B is in a process where the lithium ions are absorbed in the active material for the cathode. However, since moving speed of the lithium ions in the active material is slow, the number of lithium ions, which are not absorbed in the active material for the cathode and left on the cathode electrode in the certain form, is larger in a battery in a deeper, initial discharge condition or a battery having lower discharge voltage at the end of the discharge, and the same condition as the battery discharged to the discharge region C is considered to be formed. Therefore, it is considered that a battery where the initial discharge is shallow, or a battery where the discharge voltage at the end of the discharge is high shows small degradation due to the heat treatment in the reflow soldering, and the degradation of the battery due to heat is more drastic as the discharge voltage becomes lower.

Therefore, in the nonaqueous-electrolyte secondary-battery where the reflow soldering is performed, the full charge condition immediately after the assembling is considered to be most preferable from the viewpoint of thermal degradation of the battery.

However, for a user side that uses the battery, in some cases, the full charge condition immediately after assembling the battery is not preferable. For example, in terms of a problem of withstanding voltage of an IC integrated circuit to be used, or operation check in a device process, it is a case that the IC integrated circuit is damaged, or a case that the operation check in the device process can not be carried out since the voltage value is too high in the voltage at full charge immediately after assembling. To this end, the battery voltage needs to be dropped to a required voltage range by discharging the battery at full charge immediately after assembling.

The invention intends to make the degradation of the battery performance due to the heat to be of practically no matter when a battery at the full charge condition immediately after assembling is discharged and the battery voltage is dropped to the required voltage, and then the nonaqueous-electrolyte secondary-battery is subjected to the reflow soldering, which is enabled by regulating the voltage at the end of the discharging in the initial discharge.

Hereinafter, the invention is further described in detail according to embodiments.

First Embodiment

Figure 5:
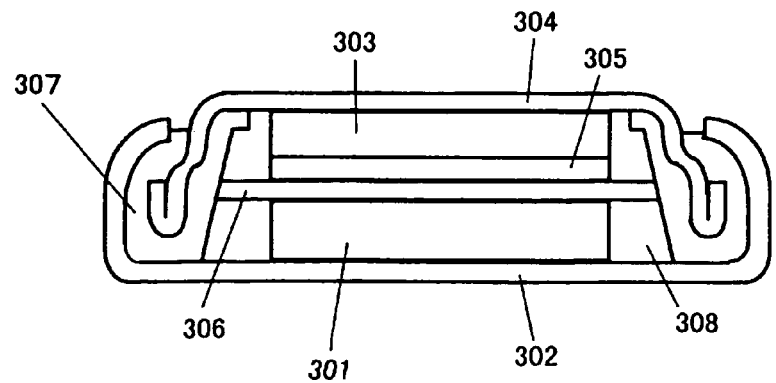
FIG. 5 is a cross section view of a nonaqueous-electrolyte secondary-battery according to the invention.

This embodiment is a case where $Li_4Ti_5O_{12}$ is used as the active material for cathode and SiO as the active material for anode. A cathode, an anode, and an electrolyte prepared in a following way were used. The dimension of the battery was 4.8 mm in outer diameter and 1.4 mm in thickness. A cross section view of the battery is shown in FIG. 5.

In the first embodiment, the cathode was prepared in the following manner. Commercial $Li_4Ti_5O_{12}$ was crushed, and then mixed with graphite as a conductive agent and polyacrylic acid as a binder in a weight ratio of $Li_4Ti_5O_{12}$/graphite/polyacrylic acid=85/13/2, thereby a cathode mixture was formed, and then the cathode mixture of 4 mg is pressed and molded into a pellet 2.4 mm in diameter at 2 ton/cm$^2$. Then, the cathode pellet 301 obtained in this way was adhered to a cathode case 302 using a conductive resin adhesive containing carbon and integrated together (cathode unitization), and then subjected to drying by heating under reduced pressure at 250° C. for 8 hours.

The anode was prepared in the following manner. Commercial SiO was crushed and used as an active material for a working electrode. The active material was mixed with the graphite as the conductive agent and the polyacrylic acid as the binder in a weight ratio of 45/40/15 respectively, thereby an anode mixture was formed. The mixture of 2 mg was pressed and molded into a pellet 2.4 mm in diameter at 2 ton/cm$^2$, and the pellet was used. Then, the anode pellet 303 obtained in this way was adhered to an anode case 304 using a conductive resin adhesive containing carbon as a conductive filler and integrated together (anode unitization), and then subjected to drying by heating under reduced pressure at 250° C. for 8 hours. Furthermore, a lithium foil 305 was punched into a circle 2 mm in diameter and 0.22 mm in thickness, and the circle was pressed on the anode pellet 303, thereby a lithium/anode pellet stacked electrode was formed. A nonwoven fabric comprising fiber glass 0.2 mm in thickness was dried and then punched into a circle 3 mm in diameter to form a separator 306. As a gasket 307, a gasket made of PEEK was used. As an electrolyte 308, lithium fluoroborate ($LiBF_4$) was dissolved in a ratio of 1.5 mol/l in a mixed solvent in a volume ratio of ethylene carbonate (EC) to γ-butyrolactone (γBL) of 1/1. The electrolyte 308 of 5.0 μl was poured into a battery can. The cathode unit and the anode unit were piled and sealed by calking, there by a battery was produced.

The battery after assembling was left for 1 week at a room temperature. At that time, the battery voltage was 2.7 V. The voltage is assumed to be the voltage value at full charge.

The battery was once discharged to 1 V, and again charged for 48 hours at 3 V. Although the battery voltage immediately after the charge shows a high value near 3 V, the voltage value was decreased with being left and stabilized at 2.6 V. Accordingly, the voltage value at full charge can be confirmed.

The battery which was left for 1 week after assembling was discharged at constant current of 5 μA, and the discharge voltage of the battery was measured for a predetermined time, thereby an initial discharge curve was obtained. A graph of the initial discharge curve is shown in FIG. 1. The graph as shown in FIG. 1 is a graph by plotting discharge voltage (V) inordinate and discharge capacity (mAh) of the secondary battery in abscissa. In the initial discharge curve of this battery, discharge is initiated from the voltage value of 2.6 V at full charge condition after assembling, and a minimum value 101 of the discharge curve is shown near the discharge voltage of 1.2 V. Thereafter, from 1.2 V to approximately 0.8 V, the curve shows a voltage plateau region 102 indicating the cell reaction, and a slope becomes gentle to an almost horizontal level. When the discharge is further continued, an inflectional value 103 in the discharge curve is seen near 0.8 V, thereafter the discharge curve abruptly drops.

Figure 2:
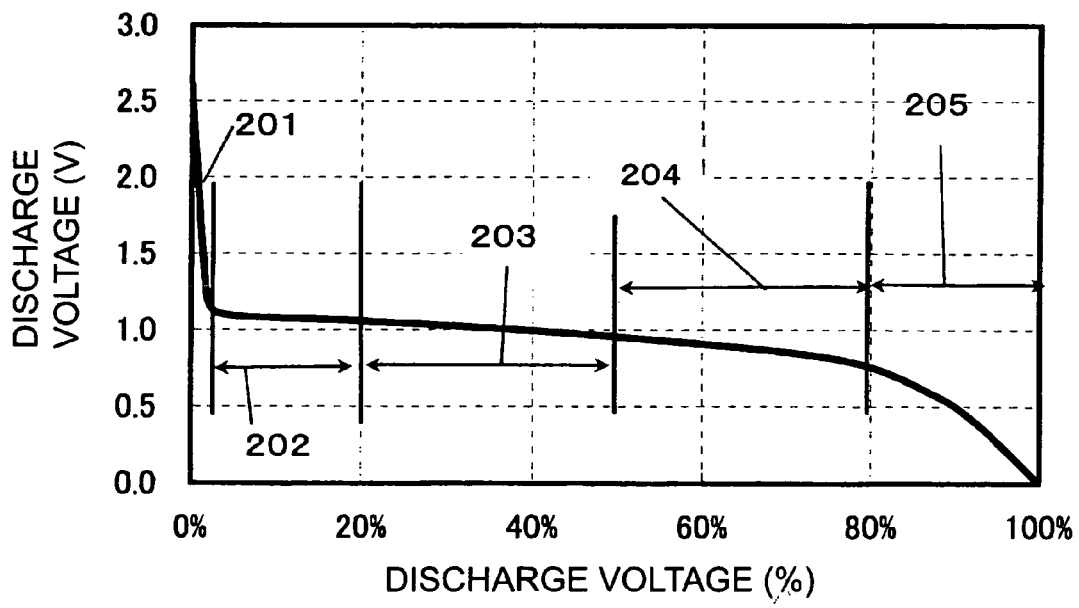
FIG. 2 is a graph showing discharge regions obtained from the discharge curve of the first embodiment.

Next, a battery indicating a discharge curve as shown in FIG. 2 was obtained by adjusting a discharge time. A graph as shown in FIG. 2 is a graph obtained by plotting the discharge voltage (V) in ordinate and a discharge ratio (%) to the total discharge capacity of the secondary battery in abscissa. In FIG. 2, a region to the minimum value of the discharge curve was assumed to be a discharge region A 201. Furthermore, the voltage plateau region 102 indicating the cell reaction is subdivided into three, and it is assumed that a region where discharge is performed beyond the discharge region A 201 in FIG. 2 to the discharge capacity of 20% is a discharge region B(1) 202, a region from the discharge capacity of 20% to 50% is a discharge region B(2) 203, and a region from the discharge capacity of 50% to the inflectional value in the discharge curve is a discharge region B(3) 204. A further discharged region was assumed to be a discharge region C 205. The battery discharged to the discharge region C was subjected to heating in a reflow oven at 240° C. as the maximum temperature. Next, the battery was left at the room temperature for the night, and then the AC internal resistance of the battery (1 kHz), height of the battery, and liquid leakage were observed. Thereafter, a battery having a voltage of 0.7 V or more was once discharged to 0.7 V at 5 μA, and then charged for 48 hours at 1.5 V, and then the discharge capacity to 0.7 V at 5 μA was measured.

The discharge ratio shows a percentage of the discharge capacity to the end of discharge, assuming that the discharge capacity to 0 V is 100%. Furthermore, the change of internal resistance shows a change in the AC internal resistance after the reflow heat treatment, assuming that the AC internal resistance (1 kHz) of the battery that is non-discharged and before reflow heat treatment is 100%. Furthermore, the liquid leakage was visually observed. The change of the battery capacity shows the capacity of each battery after the reflow heat treatment, assuming that the capacity when batteries that are non-discharged and before reflow heat treatment are once discharged at 5 μA to 1.5 V, and then charged at 3.3 V for 48 hours, and again discharged at 5 μA to 1.5 V is 100%.

The batteries in the discharge region A show a small increase in the internal resistance due to the reflow heat treatment and, in addition, hardly show a decrease in battery capacity. Since until the discharge region B(1) the batteries show no liquid leakage and decrease in battery capacity of 20% or lower, they are considered to be within a practical range. Batteries from the discharge region B(2) to the discharge region B(3) show slight internal resistance changes, however, they show extremely slight liquid leakage and, in addition, show a decrease in battery capacity of about 30%, therefore they are within a range in which there is practically no problem. On the other hand, batteries discharged until the discharge region C show an increase in internal resistance, and liquid leakage, in addition, show a drastic decrease in battery capacitance, therefore they are out of the practical range. In this way, when the discharging of the nonaqueous-electrolyte secondary-battery after assembling is performed, the battery degradation due to the reflow heat treatment becomes more drastic with an increase in discharge depth. Thus, the discharge depth is regulated from an initial discharge curve, thereby the nonaqueous-electrolyte secondary-battery adapted for the reflow heat treatment can be provided. In FIG. 2, batteries where the discharge is completed at a voltage of the discharge voltage or more that indicates the inflectional value in the discharge curve, or batteries within the discharge region A, discharge region B (1), discharge region B(2), and discharge region B(3) show slight degradation of the battery due to the reflow heat treatment, and can be sufficiently adapted for practical use. Furthermore, it is found that batteries in the case that the discharge is completed at a voltage of the discharge voltage indicating the discharge ratio of 20% or more in the discharge curve, or batteries in the discharge region A and the discharge region B(1) show particularly slight degradation due to the reflow heat treatment, that is, they are preferable.

Second Embodiment

In this embodiment, $Nb_2O_5$ was used as the active material for the cathode, and as other components, the same components as the first embodiment were used, and a battery was produced similarly to the first embodiment.

Figure 3:
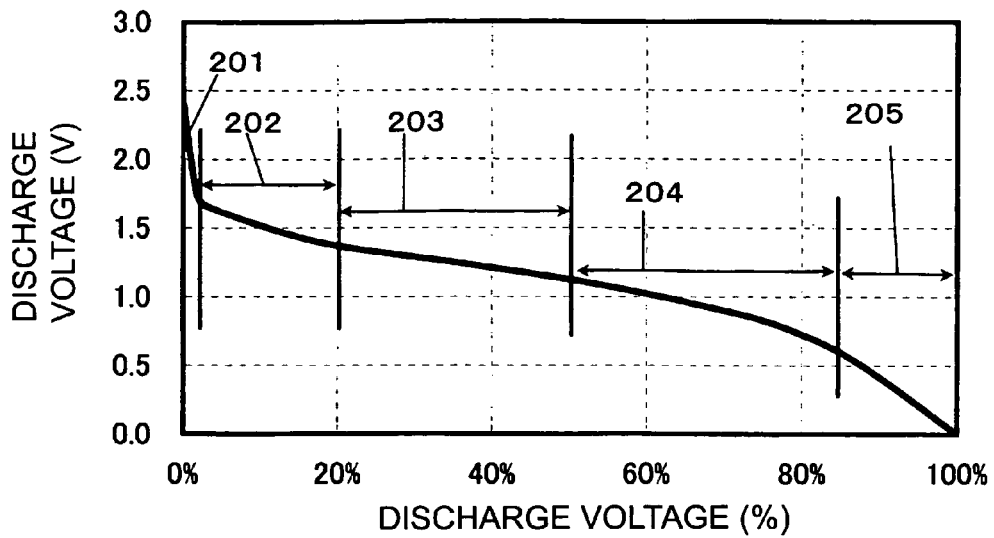
FIG. 3 is a graph showing discharge regions obtained from the discharge curve of a second embodiment.

The initial discharge curve of the battery was made in the same way as the first example. A graph as shown in FIG. 3 is a graph by plotting the discharge voltage (V) in ordinate and the discharge ratio (%) to the total discharge capacity of the secondary battery in abscissa. In FIG. 3, a region to the minimum value in the discharge curve was assumed to be a discharge region A 201. Furthermore, the voltage plateau region 102 indicating the cell reaction was subdivided into three, and it was assumed that a region where discharge was performed beyond the discharge region A 201 in FIG. 2 to the discharge capacity of 20% was a discharge region B(1) 202, a region from the discharge capacity of 20% to 50% was a discharge region B(2) 203, and a region from the discharge capacity of 50% to the inflectional value in the discharge curve was a discharge region B(3) 204. A further discharged region was assumed to be a discharge region C 205.

The battery was subjected to heating in the reflow oven at the maximum temperature of 260° C., and evaluated similarly to the first embodiment. However, in the measurement of the capacity, the battery was charged for 48 hours at a charging voltage of 2.0 V, and a discharge capacity to 0.7 V at 5 μA was measured.

As the first embodiment, batteries discharged to the discharge region C in FIG. 3 show drastic increase in the internal resistance, liquid leakage, and decrease in battery capacity, and they can not be practically used. On the other hand, batteries in which 10% of the total discharge capacity was discharged, or batteries in the discharge region A and the discharge region B(1) show small change of the internal resistance, no liquid leakage, and small decrease in battery capacity.

Third Embodiment

This embodiment employs $Nb_2O_5$ as the active material for cathode and a Li—Al alloy as the active material for anode. The cathode, in which $Nb_2O_5$ was used as the active material, was prepared according to the same procedure as the first embodiment.

For the anode, an Al sheet 2.9 mm in diameter and 0.10 mm in thickness was welded to an anode can by an ultrasonic welding. The anode can was dried and then pressed with a Li sheet 2 mm in diameter and 0.2 mm in thickness, thereby a Li—Al alloy anode was prepared.

For other components, the same components as the first embodiment were used, and a battery was produced in the same way as the first embodiment.

Figure 4:
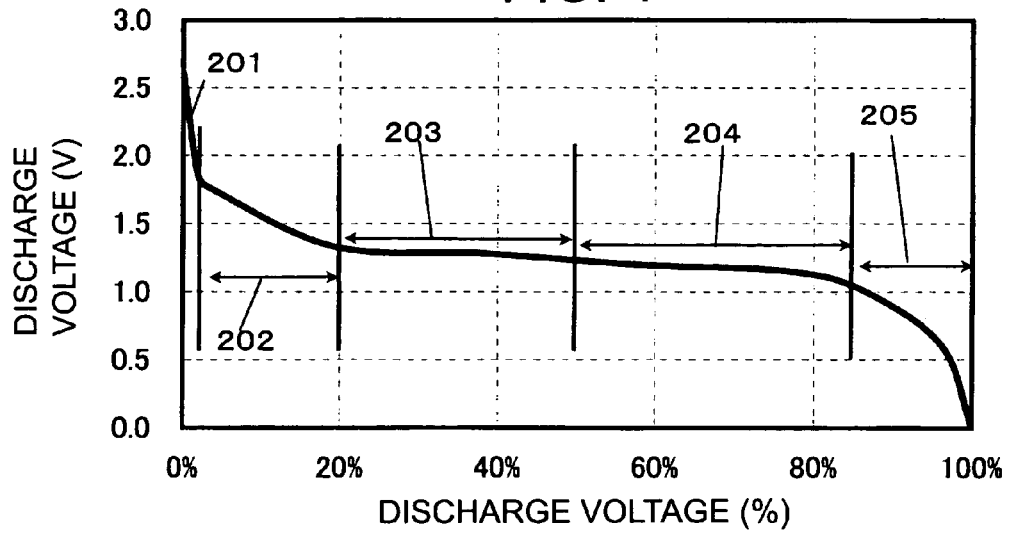
FIG. 4 is a graph showing discharge regions obtained from the discharge curve of a third embodiment.

The discharge curve of the battery is shown in FIG. 4. The battery was subjected to heating in the reflow oven at the maximum temperature of 240° C., and evaluated similarly to the first embodiment. However, in the measurement of the capacity, the battery was charged for 48 hours at the charging voltage of 2.0 V, and the capacity to 1.0 V at 5 µA was measured.

As the first embodiment, batteries discharged to the discharge region C show drastic increase in internal resistance, liquid leakage, and decrease in battery capacity, therefore they can not be practically used. On the other hand, batteries in which 10% of the total discharge capacity is discharged, or the battery in the discharge region A and the discharge region B(1) show small change of the internal resistance, no liquid leakage, and slight decrease in battery capacity.

The discharge method of the battery is not limited to the invention, and the discharge of the battery can be performed according to constant-current discharge, constant-resistance discharge, or other methods.

In discharge, a voltage lower than the battery voltage can be applied using an external power supply. However, from the viewpoint of the battery degradation due to the heat treatment during the reflow soldering, smaller discharge current is desirable at the initial discharge. Desirably, the discharge current value is small in the constant current discharge, and the electric resistance is large in the constant resistance discharge. In the constant current discharge, discharge at 100 mA/cm$^2$ or lower is desirable, and discharge at 20 MA/cm$^2$ is more preferable. While it is difficult to determine a resistance value in the constant resistance discharge without depending on the battery size, when an electrode has a diameter of 9 mm or less, the discharge resistance is desirably 100 Ω or more, and more preferably 1 kΩ or more.

Regarding a storage period after the discharging to the reflow soldering, the battery is desirably stored for 5 days or more from the end of the discharge in order to unify density distribution of materials in the battery caused by the discharge reaction.

When electronic components are mounted on a substrate by a multiple reflow process, the results are same as in the case that the reflow soldering is performed after discharging the battery, unless the soldering of the battery by the reflow process is performed at the final reflow of a substrate. Therefore, when the multiple reflow process is performed, the soldering of the battery by the reflow process is preferably performed at the final reflow of the substrate.

Although the active material for cathode is not limited in the invention, the invention is particularly effective for a battery using an active material having a voltage of 1 V or more against lithium. It is considered that this is because in the active material having the high voltage against lithium, the reaction due to the heat treatment during the reflow soldering is drastic, since the material has high, chemical activity compared with an active material having a lower voltage against lithium. Therefore, when $Li_xCoO_2$ (0≦X≦1), $Li_xNiO_2$ (0≦X≦1), $LiCo_xNi_yO_2$ (0<X, y<1), $Li_xMn_2O_4$ (0≦X≦1), $LiM_x(Mn_{(2-x)}O_2)$ (M=Cr, Co, Ni, 0<X<2), $Li_4Mn_5O_{12}$, $V_2O_5$, $MoO_3$, $LiFePO_4$, $Nb_2O_5$, or $Li_4Ti_5O_{12}$ is used, the invention is particularly effective.

In the invention, while the active material for anode is not limited, a lithium alloy such as lithium-aluminum, carbon doped with lithium, a metal oxide doped with lithium (for example, $SiO$, $WO_2$, $WO_3$), or Si doped with lithium is effective for the anode.

The electrolyte is limited in terms of an electrolyte withstanding the heat treatment during the reflow soldering. That is, a nonaqueous solvent having a boiling point of 200° C. or more at normal pressure is desirably used. Although the reflow temperature sometimes rises to about 260° C., rapture of the battery did not occur even if γ-butyrolactone (γBL) having a boiling point of 204° C. at normal pressure is used, which may be because internal pressure of the battery increases at the temperature. In a combination with the cathode or the anode, one or a mixture of those selected from propylene carbonate (PC), ethylene carbonate (EC), γ-butyrolactone (γBL), methyl-tetragrime, sulfolane, and 3-methyl-sulfolane is preferably used.

A polymer can be used in addition to the above organic solvents. As the polymer, a polymer which has been generally used can be used, for example, polyethylene oxide (PEO), polypropylene oxide, polyethyleneglycol diacrylate crosslinked polymer, polyvinylidene fluoride, poluphosphazene cross-linked polymer, polypropyleneglycol diacrylate cross-linked polymer, polyethyleneglycol methyletheracrylate cross-linked polymer, and polypropyleneglycol methyletheracrylate cross-linked polymer are preferable.

Impurities in the electrolyte (nonaqueous solvent) mainly include moisture and organic peroxides (for example, glycols, alcohols, or carbonic acids). Each of the impurities is considered to form an insulative coating on a surface of a graphitized material, thereby increase interfacial resistance of an electrode. Therefore, it may affect on decrease in a cyclic life or capacity. In addition, it may increase self-discharge during storage at high temperature (60° C. or more) From these, the impurities are preferably reduced in the electrolyte containing the nonaqueous solvent as much as possible. Specifically, the moisture of 50 ppm or lower and the organic peroxide of 1000 ppm or lower are preferable.

As a supporting electrolyte, lithium-phosphate cyclofluoride ($LiPF_6$), lithium borofluoride ($LiBF_4$), lithium trifluorometasulfonate ($LiCF_3SO_3$), lithium bisperfluoromethylsulfonylimide ($LiN(CF_3SO_2)$), which were supporting electrolytes containing fluorine, were stable thermally and electrically. An amount of it dissolved into the nonaqueous solvent is desirably 0.5 to 3.0 mol/l, and more desirably 1.5 to 2.5 mol/l.

In particular, when a mixed solvent of ethylene carbonate (EC) and γ-butyrolactone (γBL) is used as the organic solvent, and lithium-phosphate cyclofluoride ($LiPF_6$) or lithium borofluoride ($LiBF_4$) is used as the supporting electrolyte, preferable results are obtained.

For a separator, an insulative film having a large ion transmittance and a predetermined mechanical strength is used. Although fiber glass can be used most stably for reflow soldering, resin such as polyphenylene sulfide, polyethylene terephthalate, polybuthylene terephthalate, polyamide, and polyimide, which have a thermal deformation temperature of 230° C. or more, can be also used. Regarding a pore size of these parator, a size in a range generally used for battery is used. For example, 0.01 to 10 µm is used. Regarding thickness of the separator, thickness in a range generally used for battery, for example, 5 to 300 µm is used.

For a gasket, although polypropylene are typically used, when there flow soldering was performed, resin having the thermal deformation temperature of 230° C. or more, such as polyphenylene sulfide, polyethyleneterephthalate, polyamide, liquid crystal polymer (LCP), tetrafluoroethylene-perfluoroalkylvinylether copolymer resin (PFA), polyetheretherketone resin (PEEK), and polyethernitrile resin (PEN) did not show rupture at the reflow temperature, in addition, did not cause problems such as liquid leakage due to deformation of the gasket even in storage after the reflow.

Alternatively, polyetherketone resin (PEK), polyarylate resin, polybuthylene terephthalate resin, polycyclohexanedimethylene terephthalate resin, polyether sulfone resin, polyaminobismaleimide resin, polyetherimide resin, and fluorine resin can be used. In addition, it has been found from experiments that even if these materials are added with fiber glass, mica whisker, and fine ceramic powder in an additive rate of about 30% by weight or lower, the same effects as in this experiment are shown.

A method for manufacturing the gasket includes an injection molding process and a thermocompression process. The injection molding process is most common as a process for molding the gasket. It is effective for improving a shape or crystallinity after injection molding that heat treatment is performed at a melting point or lower for about 0.5 to 10 hours in a vacuum, atmosphere, or an inert atmosphere. However, when molding accuracy is sacrificed for cost reduction, a liquid sealing agent is necessarily used to supplement airtightness.

The thermocompression process is a process where thermocompression molding is performed at a melting point or lower using a sheet material having a large thickness compared with a gasket pattern of a molding as a raw molding, thereby a final molding is obtained. Generally, when a thermoplastic-resin molding, which is molded from the raw molding at the melting point or lower by the thermocompression molding, is heated, a property that tends to resume the original shape of the raw molding is shown. Accordingly, the nonaqueous-electrolyte secondary-battery, where a space should be essentially formed between an outer and inner cans (metal) and the gasket (resin), or sufficient stress for sealing should not be obtained between the can and the gasket, is used with the gasket, thereby the space is not formed between the outer and inner cans (metal) and the gasket (resin) because of expansion of the gasket due to the heat treatment (reflow soldering), or the sufficient stress for sealing can be obtained between the cans and the gasket. In addition, a property that tends to resume the original shape of the raw molding with time is provided, therefore it is also effective for a battery which is not subjected to the reflow soldering.

Particularly, in the gasket using the tetrafluoroethylene-perfluoroalkylvinylether copolymer resin (PFA), a gasket by the compression molding, where the gasket was produced by heating and pressing a sheet material, was better in sealing performance than a gasket by the injection molding. This is because PFA has rubber elasticity; and while a molding by the injection molding shrinks at the reflow temperature, a molding by the thermocompression molding tends to resume thickness of the sheet before molding at the reflow temperature; therefore internal pressure of a sealing portion increases and thus further improved sealing-airtightness can be achieved.

In the case of the coin or button battery, a liquid sealing agent of one or a mixture of asphalt pitch, butyl rubber, fluorine based oil, chlorosulfonic polyethylene, and epoxy resin is used. When the liquid sealing agent is transparent, it may be colored to make it clear whether the agent has been coated. A method for coating the sealing agent includes pouring of the sealing agent into the gasket, coating on the cathode and anode cans, and dipping the gasket into a sealing agent solution.

Regarding an electrode pattern, when a battery pattern is coin or button, a mixture of the active material for cathode or the active material for anode is pressed into a pellet pattern and used. When it is a thin coin or button, the electrode molded into a sheet pattern can be punched and used. Thickness or diameter of the pellet is determined depending on a battery size.

As a method for pressing the pellet, while a method that is generally employed can be used, particularly a die press process is preferable. Press pressure, which is not particularly limited, is preferably 0.2 to 5 ton/cm$^2$. Press temperature is preferably between the room temperature and 200° C.

The electrode mixture can be added with the conductive agent, binder, or a filler. A type of the conductive agent, which is not particularly limited, can be metal powder, and particularly carbon-based one is preferable. Carbon material is most typical, and natural graphite (scaled graphite, flake graphite, and earthy graphite), artificial graphite, carbon black, channel black, thermal black, furnace black, acetylene black, or carbon fiber is used. In metals, metal powder or metal fiber of copper, nickel, and silver is used. Conductive polymer is also used.

Regarding an additive rate of carbon, while it is not particularly limited since a mixing ratio is different depending on electric conductivity of the active material or an electrode pattern, in the anode, 1 to 50% by weight is preferable, and particularly 2 to 40% by weight is preferable.

When grain size of the carbon is in a range of 0.5 to 50 µm in average grain size, preferably in a range of 0.5 to 15 µm, and more preferably 0.5 to 6 µm, contact within the active material improves, an electron conduction network is improvably formed, and an amount of active material that is not involved in an electrochemical reaction decreases.

The binder is preferably insoluble in the electrolyte, however it is not particularly limited. Typically, one of polysaccharides, thermoplastic resin, thermosetting resin, and polymers having the rubber elasticity, such as polyacrylic acid and polyacrylic; acid neutralizer, polyvinyl alcohol, carboxymethyl cellulose, starch, hydroxypropyl cellulose, regenerated cellulose, diacetyl cellulose polyvinylchloride, polyvinyl pyrrolidone, tet rafluoroethylene, polyvinylidene fluoride, polyethylene, polypropylene, ethylene-propylene-diene polmer (EPDM), sulfonic EPDM, styrene-butadiene rubber, polybutadiene, fluorine rubber, poluethylene oxide, polyimide, epoxy resin, phenol resin, or a mixture there of is used. An additive rate of the binder, which is not particularly limited, is preferably 1 to 50% by weight.

As the filler, an fabric material can be used unless it causes a chemical reaction in a structured battery. In the invention, franc such as carbon fabric or glass fabric is used. An additive rate of the filler, which is not particularly limited, is preferably 0 to 30% by weight.

As a current collector for the active material for electrode, a metal sheet having small electric resistance is preferable. For example, stainless steel, nickel, aluminum, titanium, tungsten, gold, platinum and baked carbon, in addition, aluminum or stainless steel whose surface is treated with carbon, nickel, titanium, or silver are used as materials for the cathode as the stainless steel, duplex stainless is effective against corrosion. In the case of the coin button battery, nickel plating is performed on an outer side of the battery. A treatment process includes wet plating, dry plating, CVD, PVD, cladding by press, and coating.

Stainless steel, nickel, copper, titanium, aluminum, tungsten, gold, platinum, and baked carbon, in addition, copper or stainless steel whose surface is treated with carbon, nickel, titanium, or silver, and an Al—Cd alloy are used a materials for the anode. A treatment process includes the wet planting, dry plating, CVD, PVD, cladding by press, and coating.

Cans of the cathode and anode that are current collectors of the active material for electrode is welded with a terminal for making contact with a substrate. Stainless steel or iron subjected to nickel plating, gold plating, or solder plating is used for a terminal material. The terminal is welded to the can by resistance welding or laser welding.

The active material for electrode can be fixed to the current collector using a conductive adhesive. As the conductive adhesive, resin dissolved in a solvent added with the carbon or metal powder or fabric, or a dissolved conductive polymer is used.

In the case of the pellet-like electrode, the adhesive is applied between the current collector and the electrode pellet to fix the electrode. In this case, the conductive adhesive often contains thermosetting resin.

Application of the nonaqueous-electrolyte secondary-battery of the invention, which is not particularly limited, includes a backup power supply for cellular phones and pagers, and a power supply for a watch having a power generation function.

The battery of the invention is desirably assembled in a dehumidification atmosphere or an inert gad atmosphere. Furthermore, it is preferable that components to be assembled are previously dried. As a method for drying or dehydrating the pellet, sheet and other components, a generally employed method can be used. Particularly, one or a combination of hot wind, vacuum, infrared radiation, far-infrared radiation, electron beam and low humidity wind are preferably used. Temperature is preferably in a range of 80 to 350° C., in particular, a range of 100 to 250° C. is preferable. Water content is preferable 2000 ppm or lower in the whole battery, and in each of the cathode mixture, anode mixture, and electrolyte, 50 ppm or lower is preferably in terms of improvement in charge and discharge cycle characteristics.

Heating the pellet itself is particularly effective, and temperature in a range of 180 to 280° C. is preferable. Heating time is appropriately 1 hour or more, and the vacuum, atmosphere, and inert gas atmosphere can be selected. Regarding heating temperature, the reflow soldering temperature or more is a rough standard, and heating conditions needs to be determined in the light of strength of the organic binder. Each of the components is heated at the reflow soldering temperature or more before assembling, thereby even if the battery is subjected to the reflow soldering temperature or more, a sudden reaction hardly occurs. In addition, impregnation of the electrolyte into the pellet is improved, which is significantly advantageous for improving the battery characteristics in the invention employing an electrolyte having a high melting point and high viscosity.

What is claimed is:

1. A method of reflow soldering a non-aqueous electrolyte secondary battery comprised of a non-aqueous electrolyte and a cathode having an active material containing lithium ions, comprising the steps of:
   discharging the non-aqueous electrolyte secondary battery to a first discharge voltage different from a second discharge voltage at an inflection point in a discharge curve of the non-aqueous electrolyte secondary battery having an axis of abscissa representing discharge capacity and an axis of ordinate representing discharge voltage;
   placing the discharged non-aqueous electrolyte secondary battery on a substrate; and
   exposing the substrate to a reflow soldering temperature to reflow solder the non-aqueous secondary battery to the substrate;
   wherein the first discharge voltage is higher than the second discharge voltage to prevent degradation of characteristics of the non-aqueous electrolyte secondary battery resulting from decomposition of the non-aqueous electrolyte due to reaction of the non-aqueous electrolyte with excessive lithium ions in the cathode active material when the non-aqueous electrolyte secondary battery is exposed to the reflow soldering temperature.

2. A method according to claim 1; wherein the degradation of characteristics of the non-aqueous electrolyte secondary battery comprises at least one of a decrease in capacity and an increase in internal resistance of the non-aqueous electrolyte secondary battery.

3. A method according to claim 1; wherein the inflection point in the discharge curve of the non-aqueous electrolyte secondary battery is an inflection point at the end of a voltage plateau region in the discharge curve.

4. A method according to claim 3; wherein the first discharge voltage has a voltage value at which the substrate is damaged.

5. A method according to claim 3; wherein the first discharge voltage has a voltage value lower than a voltage value at which the substrate is damaged.

6. A method according to claim 1; wherein the first discharge voltage has a voltage value at which the substrate is damaged.

7. A method according to claim 6; wherein the first discharge voltage has a voltage value lower than a voltage value at which the substrate is damaged.

8. A method of reflow soldering a non-aqueous electrolyte secondary battery comprised of a cathode having an active material containing lithium ions and a non-aqueous electrolyte, comprising the steps of:
   discharging an electric capacity of the non-aqueous electrolyte secondary battery;
   placing the discharged non-aqueous electrolyte secondary battery on a substrate; and
   exposing the substrate to a reflow soldering temperature to reflow solder the non-aqueous secondary battery to the substrate;
   wherein the discharged electric capacity of the non-aqueous electrolyte secondary battery is 80% or less of a total discharge capacity of the non-aqueous electrolyte secondary battery to prevent degradation of characteristics of the non-aqueous electrolyte secondary battery resulting from decomposition of the non-aqueous electrolyte due to reaction of the non-aqueous electrolyte with excessive lithium ions in the cathode active material when the non-aqueous electrolyte secondary battery is exposed to the reflow soldering temperature.

9. A method according to claim 8; wherein the discharged electric capacity of the non-aqueous electrolyte secondary battery is 20% or less of the total discharge capacity of the non-aqueous electrolyte secondary battery.

10. A method according to claim 8; wherein the discharged electric capacity of the non-aqueous electrolyte secondary battery is 10% or less of the total discharge capacity of the non-aqueous electrolyte secondary battery.

11. A method according to claim 8; wherein the degradation of characteristics of the non-aqueous electrolyte secondary battery comprises at least one of a decrease in capacity and an increase in internal resistance of the non-aqueous electrolyte secondary battery.

* * * * *